US008218934B1

(12) United States Patent
Jones et al.

(10) Patent No.: US 8,218,934 B1
(45) Date of Patent: Jul. 10, 2012

(54) MONOLITHIC OPTICALLY-DRIVEN HIGH FREQUENCY POWER AMPLIFIER

(75) Inventors: Allen W. Jones, Cedar Rapids, IA (US); Don L. Landt, Palo, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 403 days.

(21) Appl. No.: 12/572,645

(22) Filed: Oct. 2, 2009

(51) Int. Cl.
*G02B 6/10* (2006.01)
*G02B 6/12* (2006.01)
(52) U.S. Cl. .......... 385/132; 385/14; 330/308; 438/479; 257/E21.09
(58) Field of Classification Search .......... 385/14, 385/129–132; 330/308; 438/479; 257/E21.09
See application file for complete search history.

(56) References Cited

U.S. PATENT DOCUMENTS

| 5,652,811 | A  | * | 7/1997  | Cook et al. | 385/14  |
| 7,639,912 | B2 | * | 12/2009 | Wang et al. | 385/39  |
| 7,969,701 | B1 | * | 6/2011  | Landt et al.| 361/91.4 |

* cited by examiner

*Primary Examiner* — Daniel Petkovsek
(74) *Attorney, Agent, or Firm* — Donna P. Suchy; Daniel M. Barbieri

(57) ABSTRACT

A power amplifying apparatus comprises a base layer hosting a power supply, a core insulating layer, a growth layer, and a high power amplifier layer. The high power amplifier layer hosts a control section, a first drive and amplification section, an electrical (RF) signal to optical signal converter section, a plurality of photolithically defined substrate channels forming embedded optical waveguide structures for optical signal routing, an optical signal to electrical signal converter section, a second drive and amplification section, and at least one high frequency and high breakdown voltage power transistor.

6 Claims, 4 Drawing Sheets

MONOLITHIC OPTICALLY-DRIVEN HIGH FREQUENCY POWER AMPLIFIER

FIELD

The present disclosure relates generally to power amplifiers. More specifically, the present disclosure relates to a monolithic optically-driven high frequency power amplifier.

BACKGROUND

High-power RF (radio frequency) & microwave applications (e.g., switched power amplifiers, high-level mixers, transmit/receive (TR) switches, series field effect transistors (FETs), etc.) require power amplifiers capable of providing high output power, efficiency and transmit bandwidth.

SUMMARY

In some embodiments, a power amplifying apparatus includes a first gallium arsenide (GaAs) substrate, further including at least one photonic power supply laser diode, a diamond substrate formed over the first GaAs substrate, a silicon substrate formed over the diamond substrate, and a second GaAs substrate, further including, at least one active splitter receiving an input signal, at least one laser driver, at least one laser diode, at least one photo diode, the at least one laser diode converting an electrical input signal into a light signal and transmitting the light signal through one or more optical waveguides and the at least one photo diode converting the light signal into an electrical signal for driving a gate drive amplifier implanted in the GaAs substrate, at least one gallium nitride (GaN) switch, and at least one photonic power supply photo diode array.

In further embodiments, a method for forming a power amplifying apparatus includes forming a first gallium arsenide (GaAs) substrate, further including implanting a photonic power supply laser diode within the first GaAs substrate, forming a diamond substrate over the first GaAs substrate, forming a silicon substrate over the diamond substrate, and forming a second GaAs substrate, further including, implanting within the second GaAs layer at least one active splitter receiving an input signal, at least one laser driver, at least one laser diode, at least one photo diode, the at least one laser diode converting an electrical input signal into a light signal and transmitting the light signal through one or more optical waveguides and the at least one photo diode converting the light signal into an electrical signal for driving a gate drive amplifier, at least one gallium nitride (GaN) switch, and at least one photonic power supply photo diode array.

It is to be understood that both the foregoing general description and the following detailed description are exemplary and explanatory only and are not restrictive of the invention claimed. The accompanying drawings, which are incorporated in and constitute a part of the specification, illustrate embodiments of the disclosure and together with the general description, serve to explain the principles of the disclosure.

BRIEF DESCRIPTION OF THE DRAWINGS

The numerous advantages of the present disclosure may be better understood by those skilled in the art by reference to the accompanying figures in which.

DETAILED DESCRIPTION

Figure 1:
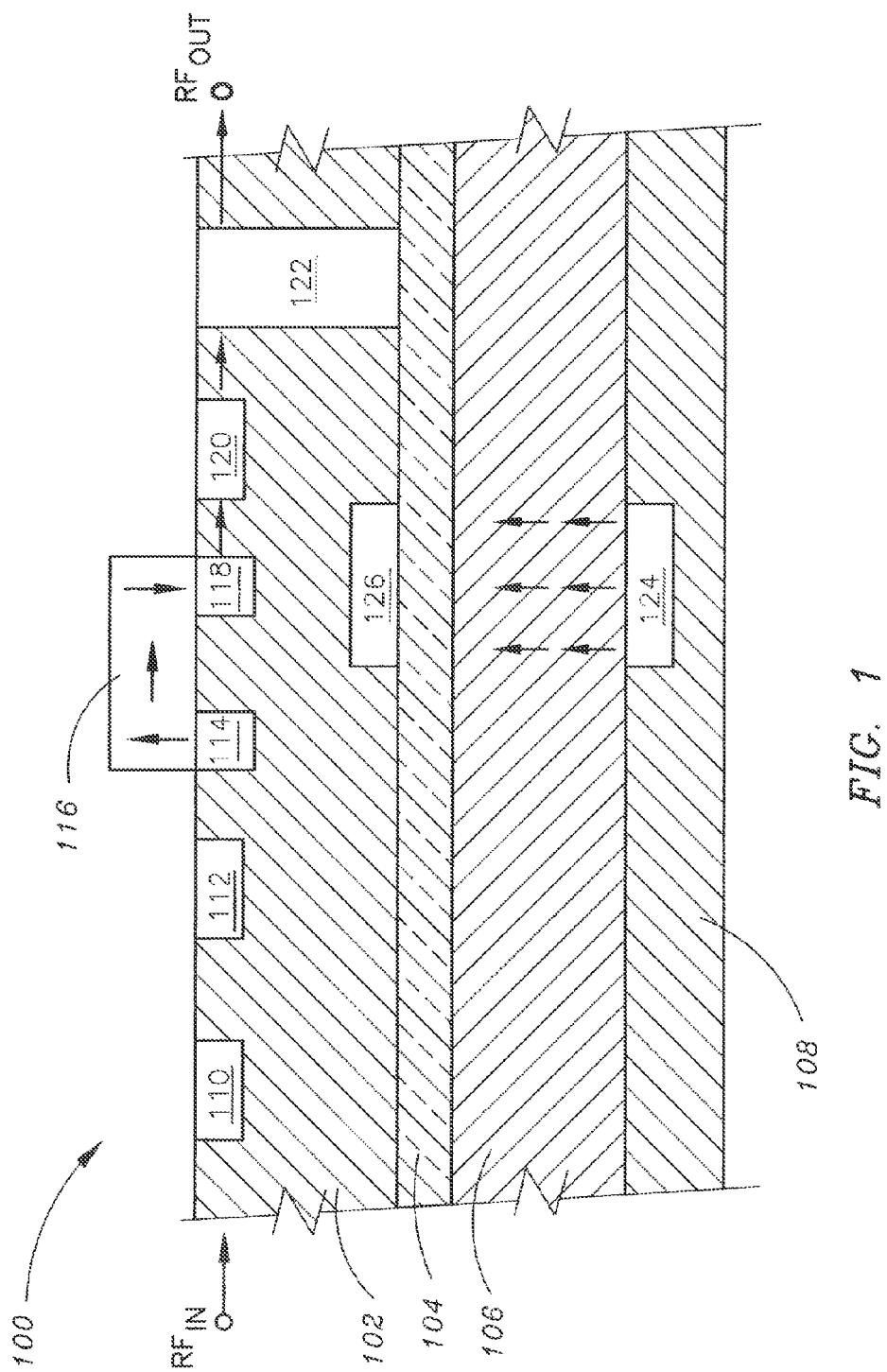
FIG. 1 depicts a cross-sectional view of a power amplifying apparatus according to an exemplary embodiment of the disclosure.

Reference will now be made in detail to embodiments of the disclosure, examples of which are illustrated in the accompanying drawings.

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings. Skilled artisans will recognize the examples provided herein have many useful alternatives and fall within the scope of the present teachings.

Figure 2:
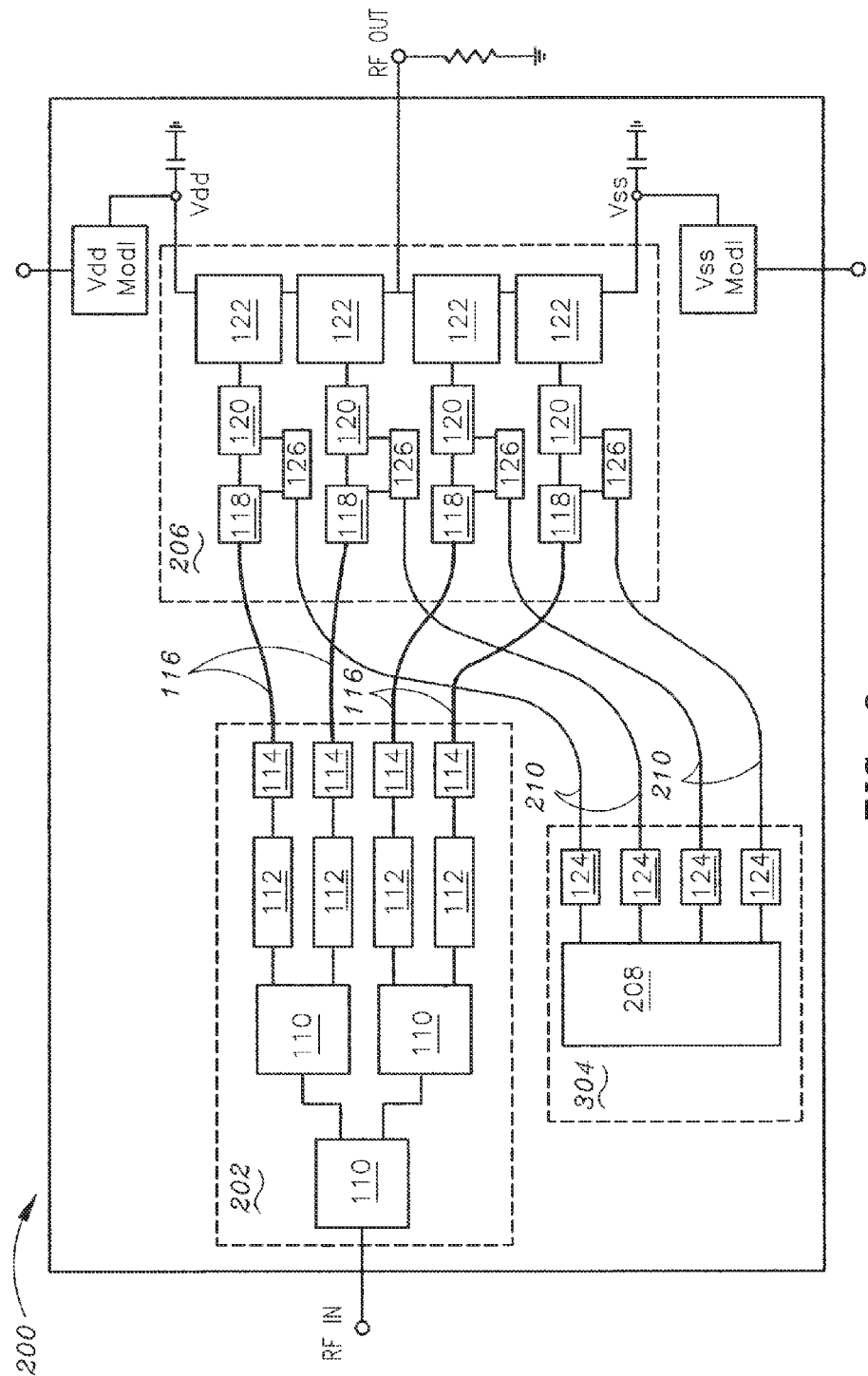
FIG. 2 depicts a block diagram of a power amplifying apparatus according to an exemplary embodiment of the disclosure.
Figure 3:
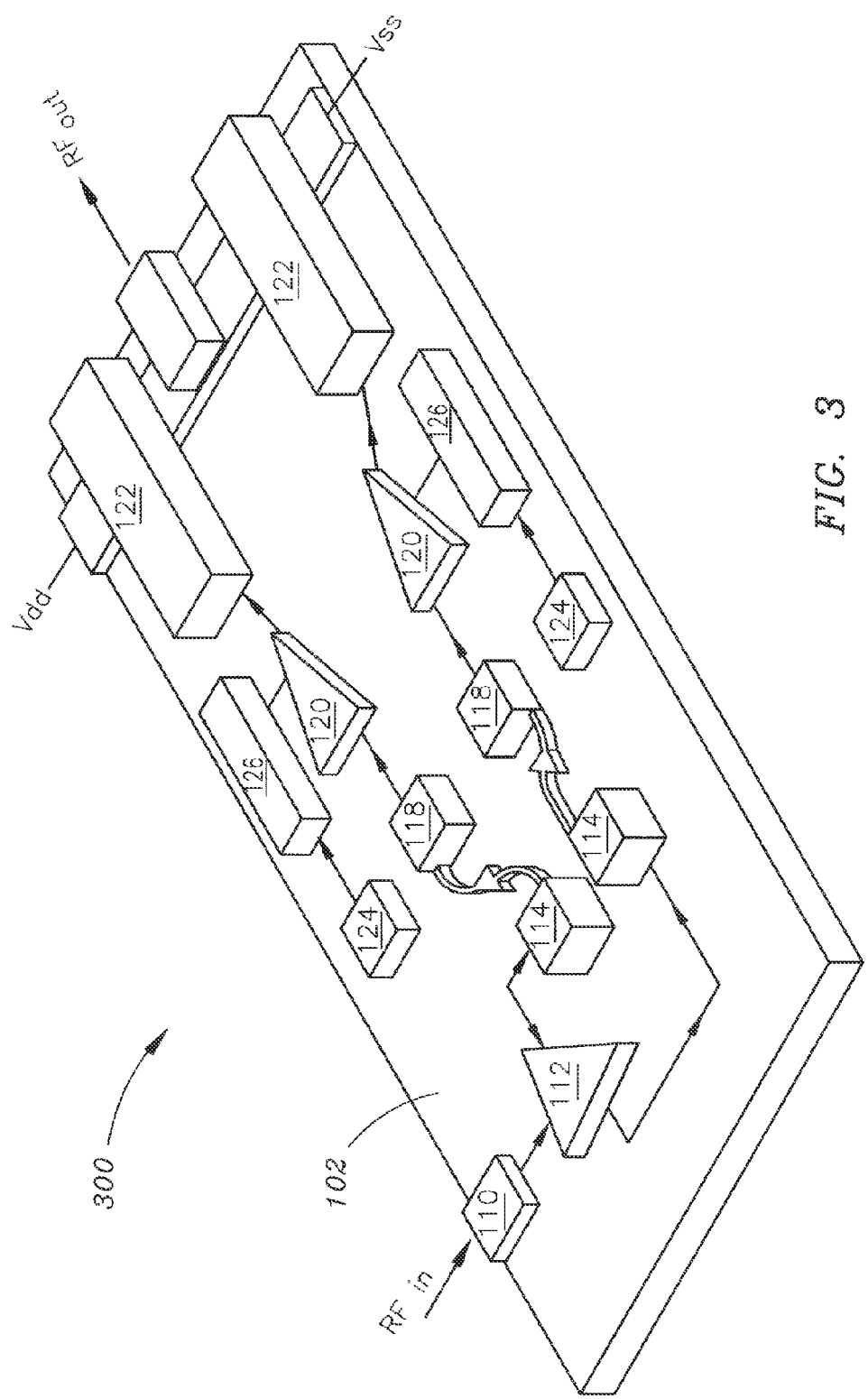
FIG. 3 is a pictorial representation of a power amplifying apparatus according to an exemplary embodiment of the disclosure.

Referring to FIGS. 1-3, an embodiment of a power amplifying apparatus 100 is shown. FIG. 1 depicts a cross-sectional view of a power amplifying apparatus 100 according to an exemplary embodiment of the disclosure. FIG. 2 depicts a block diagram 200 of a power amplifying apparatus 100 according to an exemplary embodiment of the disclosure. FIG. 3 is a pictorial representation 300 of a power amplifying apparatus 100 according to an exemplary embodiment of the disclosure. In some embodiments of the disclosure, a power amplifying apparatus 100 includes a high power amplifier layer 102 hosting a control section 110, a first drive and amplification section 112, an electrical (RF) signal to optical signal converter section 114, a plurality of photolithically defined substrate channels 116 forming embedded optical waveguide structures for optical signal routing, an optical signal to electrical signal converter section 118, a second drive and amplification section 120, and at least one high frequency and high breakdown voltage power transistor 122. According to the present disclosure, the power amplifying apparatus 100 may have a wide range of application fields, such as an internally matched power amplifier, a power MMIC (Monolithic Microwave Integrated Circuit), a microwave power amplifier, a millimeter-wave power amplifier, etc. Power amplifying apparatus 100 may further include a base layer 108 hosting a power supply 124, a core insulating layer 106, and a growth layer 104. Specific embodiments of the monolithic platform 100 are discussed further below.

In a specific embodiment, power amplifying apparatus 100 includes a first gallium arsenide (GaAs) substrate (base layer) 108 further including (e.g., implanted in the first GaAs substrate) at least one photonic power supply laser diode 124, a diamond substrate (insulating layer) 106 formed over the first GaAs substrate 108, a silicon substrate (growth layer) 104 formed over the diamond substrate 106, and a second GaAs substrate (high power amplification layer) 102, further including (e.g., implanted in the second GaAs substrate) at least one active splitter 110 receiving an input signal, at least one laser driver and amplifier 112, at least one laser diode 114, at least one photo diode 118, the at least one laser diode converting an electrical input signal into a light signal and transmitting the light signal through one or more optical waveguide assemblies 116 and the at least one photo diode 118 converting the light signal into an electrical signal for driving a gate drive amplifier 120, at least one gallium nitride (GaN) switch 122, and at least one photonic power supply photo diode array 126.

In one embodiment, power amplifying apparatus 100 may include a first GaAs layer host substrate 108 (base layer) hosting a radio-frequency (RF) optical signal link and a power supply 124 (e.g., a photonic power supply and/or a photo diode array). For instance, first GaAs layer 108 may be semi-conductor host substrate for a power supply 124. In one embodiment, a power supply 124 is a photonic power supply laser diode implanted in the first GaAs substrate 108. Photonic power supply laser diode 124 creates high power density illumination for a photo diode array included in the power amplifying apparatus 100. Photonic power supply laser diode 124 may operate on a wavelength suitable for providing isolation of the power supply laser diode 124 from the input RF signal and/or the signal chain optical link.

Power amplifying apparatus 100 may also include a diamond substrate layer (insulating layer) 106. The diamond layer 106 may be a CVD diamond layer in that the preferred method may be to deposit the diamond layer on the prepared surface by chemical vapor deposition (CVD). The diamond layer 106 may be a core material layer formed to provide high thermal conductivity, high breakdown voltage, and low electrical loss for the power amplifier. The diamond layer 106 may be disposed over the first GaAs substrate and under a silicon growth layer. The diamond layer 106 may be applied to a prepared and seeded surface of the first GaAs layer host substrate 108 by methods known in the art.

Power amplifying apparatus 100 may further include a silicon layer (growth layer) 104 disposed over the diamond layer 106. A silicon layer may be a temporary host layer and may provide growth of various power amplifying apparatus 100 components. For example, growth layer 104 (e.g., solid phase silicon layer) may temporarily host growth of a transistor 122 such as a GaN switching transistor and/or a field effect transistor (FET), monolithic microwave integrated circuit, etc. To form the silicon layer 104, a thin layer of high resistivity silicon may be bonded onto a substrate (e.g., the diamond layer 106). For instance, following the bonding of the diamond layer 106, a silicon layer 104 may be deposited and bonded over the diamond layer 106. An area for the fabrication of GaN (or AlGaN) devices may be defined, and the silicon is etched away from those areas. Following this GaN (or AlGaN) devices are fabricated on the GaN (or AlGaN) surface. In one embodiment, ions are implanted into the silicon layer 104 while the silicon layer 104 is heat treated at a low temperature thereby forming a growth layer 104, and a transistor 122 is formed of the growth layer 104. It is contemplated that any high-quality bulk single crystal substrate having a large area suitable for growth of gallium nitride epitaxial layers for device fabrication may be utilized.

After patterning the growth layer 104, growth layer may be removed (e.g., etching may be applied to remove the silicon growth layer 104). A transistor 122 such as a GaN switching/FET, may be formed. Transistor 122 may be formed from any other suitable wide-bandgap semiconductor material having potential applications in high-speed, high power transistor devices. The transistor components may be formed via customary transistor manufacturing steps. For instance, transistors and other high power amplifier regions (e.g., FET(s)) may be formed using semiconductor manufacturing technology (e.g., masking, photoresisting, CVD, sputtering, UV lithography, e-beam lithography, wet and dry etches, etc). The method of synthesis may be selectable to be compatible with the surface structure of the substrate. In one example, a GaN epitaxial layer may be formed homoepitaxially on, for example, a single crystal GaN substrate.

As noted, the GaN switching transistor 122 may be a GaN FET. GaN FET may be a very high performance GaN FET having a high breakdown voltage supporting high bias voltage levels and further yielding high power amplifier output power. The low junction capacitance and high frequency of this device may enable very high operational frequency and extremely wide operational bandwidth. Switching transistor 122 may further be a square wave Class D switched mode switching transistor yielding extremely high power amplifier operational efficiency.

A second GaAs substrate 102 may be bonded to the silicon layer 104. Second GaAs substrate 102 may host a plurality of high power amplification sections of the power amplifying apparatus 100. High power amplification sections may be optically driven power amplifiers, high-speed silicon CMOS circuits or high-power AlGaN/GaN amplifiers integrated on a single substrate. The second GaAs substrate 102 may also include control and drive sections 110, 112 of the power amplifying apparatus 100 implanted into the second GaAs substrate 102.

In one embodiment an input electrical (RF) signal may be driven into an active splitter 110. Active splitter 110 may split the input electrical signal into two or more signal channels. Active splitter 110 may also determine pulse width, pulse timing and phase. Active splitter 110 may be a GaAs monolithic microwave integrated circuit (MMIC). MMICs are a type of integrated circuit (IC) device that operates at microwave frequencies (1 GHz to 300 GHz). An MMIC device typically performs functions such as microwave mixing, power amplification, low noise amplification and high frequency switching. Inputs and outputs on MMIC devices are frequently matched to the standard 50 ohms. In one embodiment, power amplifier active splitter 110 may also include timing control. Active splitter 110 and timing control may be implanted within the second GaAs susbstrate 102. Active splitter 110 may then drive the RF signal into a laser driver amplifier 112.

In a preferred embodiment, power amplifying apparatus 100 may also include at least one laser driver amplifier 112 (e.g., GaAs mmic amplifier) implanted within the second GaAs susbstrate 102 and receiving the electrical signal from the active splitter 110. Laser driver amplifier 112 may amplify a received RF signal to a level suitable for driving a laser diode 114. A radio frequency (RF) signal may be input into the laser driver amplifier. Laser driver amplifier 112 may then drive the amplified RF signal to one or more laser diodes 114.

In a preferred embodiment, power amplifying apparatus 100 may also include at least one laser diode 114 (e.g., GaAs MMIC amplifier) implanted within the second GaAs susbstrate 102. The laser diode 114 converts the electrical signal to light power for complete electrical isolation in the driver chain.

The power amplifying apparatus 100 may further include one or more optical waveguide assemblies 116. Optical waveguide assembly 116 may be deposited and relieved channels for low loss transport of the optical signal to one or more photo diodes 118. The optical waveguide assembly 116 may be etched out of a wafer of suitable material (e.g., silicon oxide (SiO$_2$)) and may be readily fabricated in monolithic technology. In one embodiment, a waveguide assembly 116 may be covered with a first layer of material which is subsequently removed outside a groove formed within the waveguide assembly 116, leaving an amount of remaining residue at least nearly filling the etched groove, and that subsequently over the first a second layer of material is applied which after appropriate treatment is used as etching mask for etching the waveguide structure out of the wafer.

In one instance, waveguide assembly 116 may be embedded in a silicon oxide layer disposed substantially over at least a portion of the GaAs top layer 102. Physical isolation may be provided between the laser diode 114 and the photo diode 118 via the optical waveguide assembly 116, thereby negating mutual coupling capacitance. An optical waveguide assembly 116 may include one or more waveguides, and one or more electrical contacts located on both sides of the waveguide assembly 116, a substrate (e.g., SiO$_2$) on which the waveguide assembly 116 is formed, and a reflective lens formed at the end of the waveguide assembly 116 to redirect (e.g., at about a 45 degree angle) the light signal (e.g., beam, wave). In one embodiment, 45 degree reflective lenses may provide light reflection of the light signal on and off the planar surface of the second GaAs layer 102. In one embodiment, optical waveguide assembly 116 may employ fiber optic technology. For instance, optical waveguide assembly 116 may include optical fibers (e.g., single-mode or multi-mode optical fibers). A typical single-mode optical fiber may have a core diameter of approximately 9 microns while a multi-mode fiber has a core diameter of approximately 50 or 62.5 microns and may operate within a range of about 800-850 nm.

An optical waveguide assembly 116 may substantially hollow, straight and connected by appropriately placed mirrors. One or more optical waveguide assemblies 116 may also be curved. As noted, one or more optical waveguide assemblies 116 may be formed in a silicon oxide substrate.

Optical waveguide assembly 116 may further provide electrical isolation between the laser diodes 114 and one or more photo diodes 118. Light signals may be guided from the laser diode 114 through the one or more waveguide assemblies 116 to one or more photo diodes 118. One or more optical waveguide assemblies 116 designed as disclosed herein may provide substantially full waveform reconstruction and/or manipulation of input fields and may enable substantially optimized beam routing or highly efficient coupling to various output media (e.g. fiber or channel waveguides). One or more optical waveguide assemblies 116 disclosed herein may also enable high-fidelity mapping of spatially extended optical sources (i.e. non-paraxial or non-point-like), beam mapping or coupling functions, such as efficiently converting one mode into another one of different size or profile, or coupling geometries such as: acute-, right-, or obtuse-angle bends; forward-focusing or relaying structures; or out-of-plane bends. One or more optical waveguide assemblies 116 may be employed in a photonic signal transport structure to provide optical signal routing between multiple sources and receivers without restrictions imposed by signal overlap or intersection. Such a photonic transport layer may provide a basis for on-chip or inter-chip signal transmission in an electronic circuit environment, for example.

Upon receipt of the optical (light) signal, the photo diode 118 may convert the light signal back into an electrical signal. Converted electrical signal may drive the gate drive amplifier 120. The photo diode 118 may be implanted in the second GaAs layer 102. In one embodiment, one or more photo diodes 118 may be implanted in the GaAs layer in a region physically separated from the one or more laser diodes 114. In one embodiment, the photodiode 118 (e.g, one or more avalanche photodiodes, one or more PIN photodiodes, etc.) converts the light level of the received digital optical signal to a signal current. The photodiode 118 may deliver the extracted current to a transimpedance amplifier (TIA), for converting the current to a voltage. The voltage may be amplified by the TIA and converted to a differential signal. A post amplifier may be provided, which may be configured as a limiting amplifier delivering a specified output-voltage swing having a maximum independent of the input signal strength. A data recovery circuit performs amplitude-level analysis on the signal output by post amplifier to recover the serial digital data signal (in electrical form) from the received optical signal. A demultiplexing circuit performs a serial-to-parallel conversion on the serial digital data stream generated by the data recovery circuit to generate a multi-bit digital signal (electrical) representing a sequence of bits in the received digital optical signal.

A gate driver amplifier 120 may be a very high frequency mmic amplifier for amplifying the RF signal level for sufficient excitation to the input (gate terminal) of the GaN switching transistor 122. The gate driver amplifier 120 may be implanted in the second GaAs layer 102 and may receive the electrical signal from the photo diode 118.

The GaN switching transistor 122 may be a very high performance GaN FET. GaN FET may provide high voltage breakdown for supporting high bias voltage levels yielding high PA output power. The low junction capacitance and high $F_T$ of this device enables very high operational frequency and extremely wide operational bandwidth. In some embodiments, transistor 122 may be a square wave Class D switched mode transistor yielding an extremely high power amplifier operational efficiency.

In one embodiment, GaN switching transistor 122 may include a gallium nitride support base, a gallium nitride epitaxial film provided on a principal surface of the gallium nitride support base, a gate insulating film provided on the gallium nitride epitaxial film, a gate electrode provided on the gate insulating film, a n-type conductivity region provided in the gallium nitride epitaxial film, an n-type conductivity region provided in the n-type conductivity region, a source electrode provided on the n-type conductivity region of the gallium nitride epitaxial film; and (h) a drain electrode provided on a back side of the gallium nitride support base. A layer region is provided in the surface of the gallium nitride support base and the gallium nitride epitaxial film The power amplifying apparatus 100 second GaAs layer 102 may also include (e.g., implanted in the second GaAs layer) a photonic power supply photo diode array 126. The photonic power supply photo diode array 126 converts the light signal (power) into a DC bias for the gate driver amplifier 120 and for switching the GaN transistor 122 (e.g., GaN FET) from a the conducting/ON state to a non-conducting/OFF state.

Figure 4:
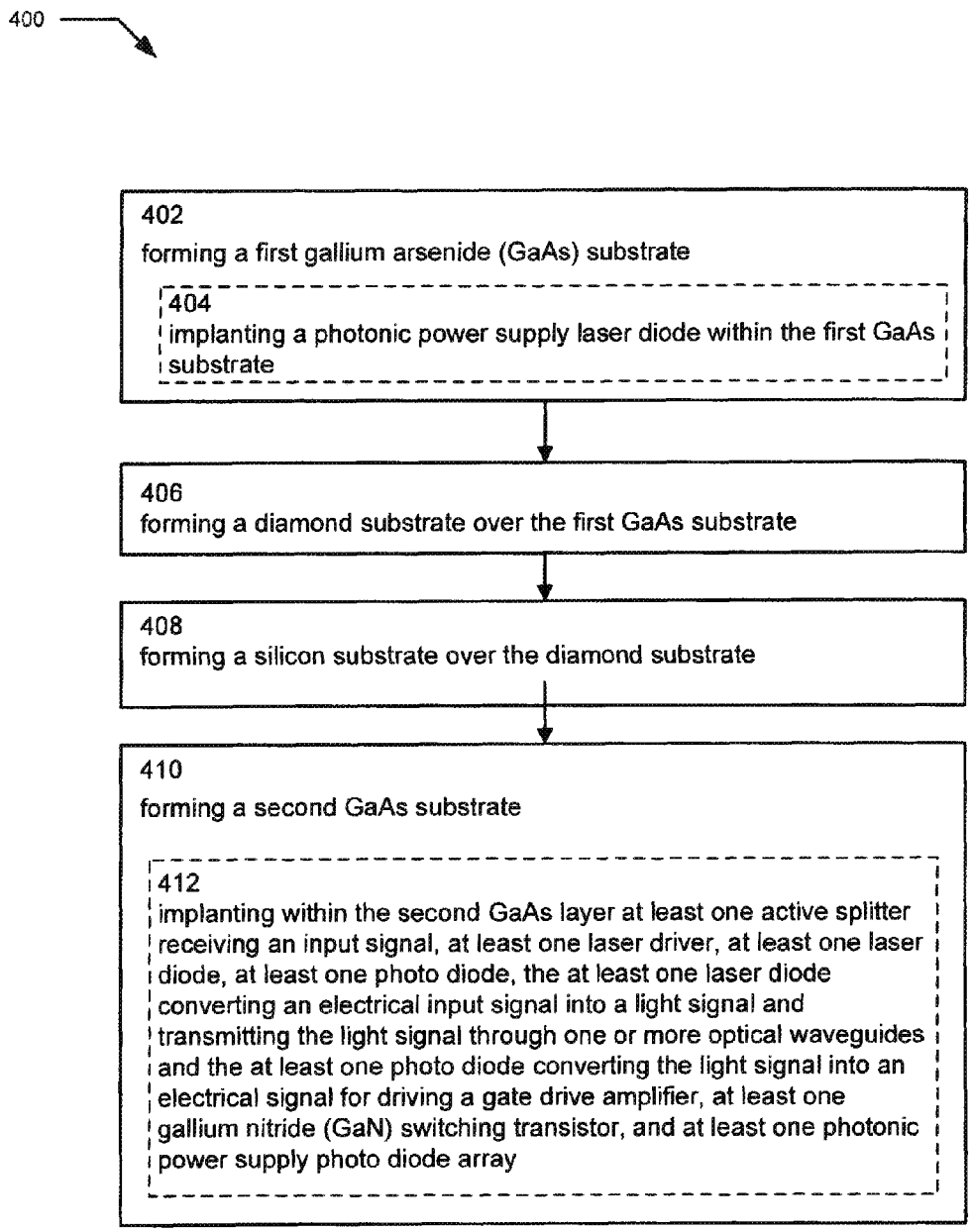
FIG. 4 is a flow diagram of a method for forming a power amplifying apparatus according to an exemplary embodiment of the disclosure.

Referring to FIG. 4, a flow diagram of a method 400 for forming a power amplifying apparatus 100 according to an exemplary embodiment of the disclosure is shown. The method 400 for forming a power amplifying apparatus includes forming a first gallium arsenide (GaAs) substrate 402, further including implanting a photonic power supply laser diode within the first GaAs substrate 404, forming a diamond substrate over the first GaAs substrate 406, forming a silicon substrate over the diamond substrate 408, and forming a second GaAs substrate 410, further including, implanting within the second GaAs layer at least one active splitter receiving an input signal, at least one laser driver, at least one laser diode, at least one photo diode, the at least one laser diode converting an electrical input signal into a light signal and transmitting the light signal through one or more optical waveguides and the at least one photo diode converting the light signal into an electrical signal for driving a gate drive amplifier, at least one gallium nitride (GaN) switch, and at least one photonic power supply photo diode array 412.

In one embodiment, a method 400 for fabricating a power amplifying apparatus 100 may include forming a first GaAs layer, bonding a CVD diamond layer onto the first GaAs layer, bonding a thin layer of high resistivity silicon onto a the CVD diamond layer, defining an area for fabrication of one or more GaN (or AlGaN) devices, depositing a GaN (or AlGaN) structure over the bonded silicon layer, etching the silicon away from the area for fabrication of one or more GaN (or AlGaN) devices, bonding a second GaAs layer over the silicon layer, further including implanting a control section, a first drive and amplification section, an electrical (RF) signal to optical signal converter section, an optical signal to electrical signal converter section, a second drive and amplification section, at least one high frequency and high breakdown voltage power transistor, and at least one photonic power supply photo diode array within the second GaAs substrate 416, bonding an amount of silicon oxide over a region of the second GaAs layer, and photolithically defining substrate channels forming embedded optical waveguide structures within the silicon oxide region, the photolithically defined substrate channels providing optical signal routing and physical isolation between the implanted electrical (RF) signal to optical signal converter section and optical signal to electrical signal converter section. The various components may be further defined as discussed above and may further be formed and deposited at least via the techniques discussed above.

A power amplifying apparatus 100 according to the present disclosure may provide an extremely lightweight and small form factor apparatus. A power amplifying apparatus 100 according to the present disclosure may further provide increased repeatability due to the components and interconnect being defined by photolithography and very high frequency operation due to the minimal inductive and capacitive parasitics with on-substrate interconnect.

Systems, methods and apparatuses in accordance with various aspects of the present disclosure provide an improved integrated circuit. In this regard, the present disclosure may be described herein in terms of functional block components and various processing steps. It should be appreciated that such functional blocks may be realized by any number of hardware, firmware, and/or software components configured to perform the specified functions. For example, the present disclosure may employ various integrated circuit components, e.g., memory elements, digital signal processing elements, look-up tables, and the like, which may carry out a variety of functions under the control of one or more microprocessors or other control devices. Such general techniques and components that are known to those skilled in the art are not described in detail herein.

It is to be noted that the foregoing described embodiments according to the invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is believed that the present disclosure and many of its attendant advantages will be understood by the foregoing description, and it will be apparent that various changes may be made in the form, construction, and arrangement of the components thereof without departing from the scope and spirit of the disclosure or without sacrificing all of its material advantages. The form herein before described being merely an explanatory embodiment thereof, it is the intention of the following claims to encompass and include such changes.

What is claimed:

1. A power amplifying apparatus comprising:
   a base layer hosting a power supply;
   a core insulating layer;
   a growth layer; and
   a power amplifier layer hosting a control section, a first drive and amplification section, an electrical (RF) signal to optical signal converter section, a plurality of photolithically defined substrate channels forming embedded optical waveguide structures for optical signal routing, an optical signal to electrical signal converter section, a second drive and amplification section, and at least one frequency and breakdown voltage power transistor.

2. The power amplifying apparatus of claim 1, wherein the base layer is a gallium arsenide substrate and the power supply is a photonic power supply laser diode implanted within the base layer.

3. The power amplifying apparatus of claim 1, wherein the core insulating layer is a diamond layer.

4. The power amplifying apparatus of claim 3, wherein the diamond layer is a chemical vapor deposition diamond layer.

5. The power amplifying apparatus of claim 1, wherein the growth layer is a silicon layer.

6. The power amplifying apparatus of claim 1, wherein the power amplifier layer is a gallium arsenide layer.

\* \* \* \* \*